United States Patent
Terasaki

(10) Patent No.: US 10,591,947 B2
(45) Date of Patent: Mar. 17, 2020

(54) POWER SUPPLY VOLTAGE MONITORING CIRCUIT

(71) Applicant: Rohm Co., Ltd., Kyoto (JP)

(72) Inventor: Fumihiko Terasaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/373,195

(22) Filed: Apr. 2, 2019

(65) Prior Publication Data

US 2019/0310677 A1 Oct. 10, 2019

(30) Foreign Application Priority Data

Apr. 5, 2018 (JP) .................................. 2018-072951

(51) Int. Cl.
  G05F 3/26 (2006.01)
  G01R 19/165 (2006.01)
  H03K 5/24 (2006.01)
  G05F 1/575 (2006.01)

(52) U.S. Cl.
  CPC ....... G05F 3/262 (2013.01); G01R 19/16519 (2013.01); G05F 1/575 (2013.01); H03K 5/24 (2013.01)

(58) Field of Classification Search
  None
  See application file for complete search history.

(56) References Cited

U.S. PATENT DOCUMENTS

| | | | | |
|---|---|---|---|---|
| 5,136,246 A | * | 8/1992 | Sakamoto | .......... G01R 31/3648 324/426 |
| 6,424,513 B1 | * | 7/2002 | Wissell | .................. H02H 3/247 361/100 |
| 2002/0125942 A1 | * | 9/2002 | Dunnebacke | ...... H03K 3/02337 330/69 |
| 2004/0174206 A1 | | 9/2004 | Matsumura | |

(Continued)

FOREIGN PATENT DOCUMENTS

| JP | 3179444 | 4/2001 |
|---|---|---|
| JP | 2001-306158 | 11/2001 |

(Continued)

*Primary Examiner* — Jeffrey A Gblende
(74) *Attorney, Agent, or Firm* — Fish & Richardson P.C.

(57) ABSTRACT

Power supply voltage monitoring circuit includes: input terminal; output terminal; ground terminal; voltage dividing circuit generating first and second divided voltages from power supply voltage applied to the input terminal; reference voltage source generating reference voltage using the power supply voltage; regulator voltage source generating regulator voltage higher than the reference voltage using the power supply voltage; comparator generating first binary output signal by comparing the reference voltage with the first divided voltage, using the regulator voltage as driving source; first switching part having main conductive path connected between the output terminal and the ground terminal and responsive to the first binary output signal; and second binary converting part generating second binary output signal in response to the second divided voltage, using the reference voltage as driving source, wherein binary (Continued)

power supply voltage monitoring output signal is generated according to logical operation of the first and second binary output signals.

13 Claims, 11 Drawing Sheets

(56) References Cited

U.S. PATENT DOCUMENTS

| | | | |
|---|---|---|---|
| 2010/0165527 A1* | 7/2010 | Callahan, Jr. | G01R 19/16571 361/79 |
| 2012/0262227 A1 | 10/2012 | Nagata | |
| 2015/0097573 A1* | 4/2015 | Chang | G01R 31/28 324/537 |
| 2019/0050011 A1* | 2/2019 | Fujimoto | H02H 9/025 |

FOREIGN PATENT DOCUMENTS

| | | |
|---|---|---|
| JP | 2004-198335 | 7/2004 |
| JP | 4397211 | 10/2009 |
| JP | 5767847 | 6/2015 |

* cited by examiner

100

200

400

600

POWER SUPPLY VOLTAGE MONITORING CIRCUIT

CROSS-REFERENCE TO RELATED APPLICATION

This application is based upon and claims the benefit of priority from Japanese Patent Application No. 2018-072951, filed on Apr. 5, 2018, the entire contents of which are incorporated herein by reference.

TECHNICAL FIELD

The present disclosure relates to a power supply voltage monitoring circuit for monitoring whether a power supply voltage is higher or lower than a predetermined voltage.

BACKGROUND

A power supply voltage monitoring circuit outputs a power supply voltage monitoring output signal externally when a power supply voltage is, for example, lower than a predetermined voltage. This power supply voltage monitoring output signal is used as an enable signal of, for example, a CPU (Central Processing Unit) or a DSP (Digital Signal Processor).

In the related art, there is provided a power supply monitoring circuit capable of operating at a low power supply voltage without deteriorating detection accuracy of power supply voltage. The power supply monitoring circuit in the related art switches one of an output of a constant-voltage generating means for generating a predetermined voltage reference value and a resistance division value of a power supply voltage, which are input to a comparator that compares the two inputs to a separate reliable predetermined voltage, by using a control means, in a low power supply voltage region in which an operation of the constant-voltage generating means is undetermined, thereby preventing an error in the power supply monitoring output due to undetermined comparator input. Further, in the related art, there is provided a general circuit configuration of the power supply monitoring circuit that compares the power supply voltage with the output of the constant-voltage circuit and outputs a monitoring signal externally when the power supply voltage drops to be less than or equal to the output of the constant-voltage circuit. In the power supply monitoring circuit of the related art, since a power supply voltage of a predetermined value or more is required for the constant-voltage circuit to function normally, the power supply monitoring circuit may not function normally in the low power supply voltage region where the power supply voltage is equal to or less than the predetermined value, and the power supply monitoring output may be erroneously output due to an undetermined voltage reference value, that is, an undetermined input state of the comparator.

In the related art, there is provided a voltage detecting circuit capable of adjusting a hysteresis voltage. In the related art, the voltage detecting circuit includes a first resistor, a second resistor, and a third resistor connected in series between a first power supply and a second power supply, and further includes a voltage dividing circuit that outputs a divided voltage value of a potential difference between the first power supply and the second power supply from an output terminal, which is a connection point between the first resistor and the second resistor. The voltage detecting circuit further includes a reference voltage circuit that generates a reference voltage, and a comparator that receives a signal based on the output of the voltage dividing circuit and the output of the reference voltage circuit and outputs a signal as an output of the voltage detecting circuit. The voltage detecting circuit further includes a switch connected in parallel with the third resistor between the second resistor and the second power supply, and a hysteresis voltage control circuit that receives a signal based on the output of the comparator and outputs a signal for controlling the switch. The hysteresis voltage control circuit outputs a signal to turn on the switch when the output of the comparator is inverted for the first time from a reset state, and outputs a signal to turn on the switch when the output of the comparator is inverted for the second time and thereafter in a state where the switch is turned off. Further, the hysteresis voltage control circuit has an input terminal to which the output of the comparator is input, a reset input terminal to which a reset signal to reset the hysteresis voltage control circuit is input, and an output terminal from which a signal for controlling the switch circuit is output.

In the related art, there is provided a reference voltage generating circuit capable of generating a reference voltage having small dependency on process, variation and temperature change and having small variation, and a power supply device using the same. In the related art, the reference voltage generating circuit has a circuit configuration in which an NMOS depletion transistor as a constant-current source is connected in series with an NMOS transistor having a threshold voltage different from that of the NMOS depletion transistor, and a drain of the NMOS depletion transistor is connected to a power supply voltage, a gate and a source thereof are connected to an output voltage terminal, and a substrate is connected to a GND potential. Further, the drain and the gate of the NMOS transistor are connected to the output voltage terminal, and the source thereof and a substrate are connected to the GND potential. The NMOS depletion transistor has a substrate bias coefficient that gives a change in the threshold voltage so that such a change is substantially equal to a voltage change of the output voltage terminal, and also has the threshold voltage so that it does not become an enhancement type.

In the related art, there is provided a power supply capable of solving a trade-off between suppression of leakage current of an output transistor and reduction in current consumption. In the related art, the power supply includes an output transistor, a power supply circuit that generates an output voltage from a power supply voltage by using the output transistor, and a leakage current absorbing circuit that absorbs a leakage current of the output transistor by using a depletion type transistor. Further, in the related art, there is provided a reference current generating circuit capable of solving a trade-off between reduction in circuit scale and reduction in current consumption. In the related art, the reference current generating circuit includes a reference voltage generator that generates a reference voltage using a depletion type transistor, and a voltage/current converter that generates a reference current from the reference voltage. In the related art, the power supply further includes an internal power supply voltage generating block that generates an internal power supply voltage upon receiving a power supply voltage, a reference voltage generating block that generates a reference voltage upon receiving the internal power supply voltage, and a power supply block that generates an output voltage from the power supply voltage so that a feedback voltage corresponding to the output voltage matches the reference voltage. The internal power supply voltage generating block includes a reference current generating circuit and an internal power supply voltage generating circuit that generates an internal power supply voltage using a reference current.

In the related art, there is provided a power supply voltage monitoring circuit capable of monitoring even a low power supply voltage by eliminating the need for a constant-voltage circuit. In the related art, the power supply voltage monitoring circuit includes a voltage dividing means that divides a power supply voltage, a comparator which receives a divided voltage and a zero voltage and compares the voltages to output a result of the comparison, and an output transistor means that outputs a monitoring signal by the output of the comparator. The comparator has a configuration in which an area ratio is given to a transistor pair constituting an input stage differential amplifier and an offset voltage obtained from the area ratio is compared with a divided voltage.

SUMMARY

Some embodiments of the present disclosure provide a power supply voltage monitoring circuit capable of monitoring whether a power supply voltage is higher or lower than a predetermined voltage, for example, even when the power supply voltage is relatively low.

According to an embodiment of the present disclosure, there is provided a power supply voltage monitoring circuit including: an input terminal; an output terminal; a ground terminal; a voltage dividing circuit configured to generate a first divided voltage and a second divided voltage from a power supply voltage applied to the input terminal; a reference voltage source configured to generate a reference voltage based on the power supply voltage; a regulator voltage source configured to generate a regulator voltage higher than the reference voltage based on the power supply voltage; a comparator configured to generate a first binary output signal by comparing the reference voltage with the first divided voltage, using the regulator voltage as a driving source; a first switching part having a main conductive path connected between the output terminal and the ground terminal and responsive to the first binary output signal; and a second binary converting part configured to generate a second binary output signal in response to the second divided voltage, using the reference voltage as a driving source, wherein a binary power supply voltage monitoring output signal to monitor a magnitude of the power supply voltage is generated according to logical operation of the first binary output signal and the second binary output signal.

In some embodiments, the binary power supply voltage monitoring output signal is generated based on at least one among an OR operation, a NOR operation, an AND operation, and a NAND operation of the first binary output signal and the second binary output signal.

In some embodiments, the power supply voltage monitoring circuit further includes a second switching part having a main conductive path connected in parallel to the main conductive path of the first switching part and responsive to the second binary output signal, wherein the binary power supply voltage monitoring output signal is generated based on a wired OR operation of the first switching part and the second switching part.

In some embodiments, the second binary converting part includes an inverter, the inverter outputs the second binary output signal from an output side in response to the second divided voltage applied to an input side, and the second binary output signal is applied to an input side of the second switching part.

In some embodiments, the second binary output signal transitions to a power supply voltage lower than the power supply voltage when the first binary output signal transitions.

In some embodiments, the second divided voltage is set to be higher than the first divided voltage.

In some embodiments, the voltage dividing circuit includes a first resistor, a second resistor, and a third resistor connected in series from the input terminal toward the ground terminal, and the first divided voltage is generated at a connection point between the second resistor and the third resistor and the second divided voltage is generated at a connection point between the first resistor and the second resistor.

In some embodiments, the voltage dividing circuit further includes a fourth resistor connected in series to the first resistor, the second resistor, and the third resistor from the input terminal toward the ground terminal, and an output of a third switching part responsive to the first binary output signal is connected to a connection point between the third resistor and the fourth resistor, and the first divided voltage has two values according to turn-on/off operation of the third switching part.

In some embodiments, the reference voltage source or the regulator voltage source is selected among a linear regulator, a depletion type voltage source, and a band gap reference circuit.

In some embodiments, both the reference voltage source and the regulator voltage source are the linear regulator.

In some embodiments, the reference voltage source is selected from the depletion type voltage source and the band gap reference circuit.

In some embodiments, the reference voltage source is the depletion type voltage source, and the regulator voltage source is the linear regulator.

In some embodiments, a pull-up resistor is connected between the output terminal and a pull-up voltage.

DETAILED DESCRIPTION

First Embodiment

Figure 1:
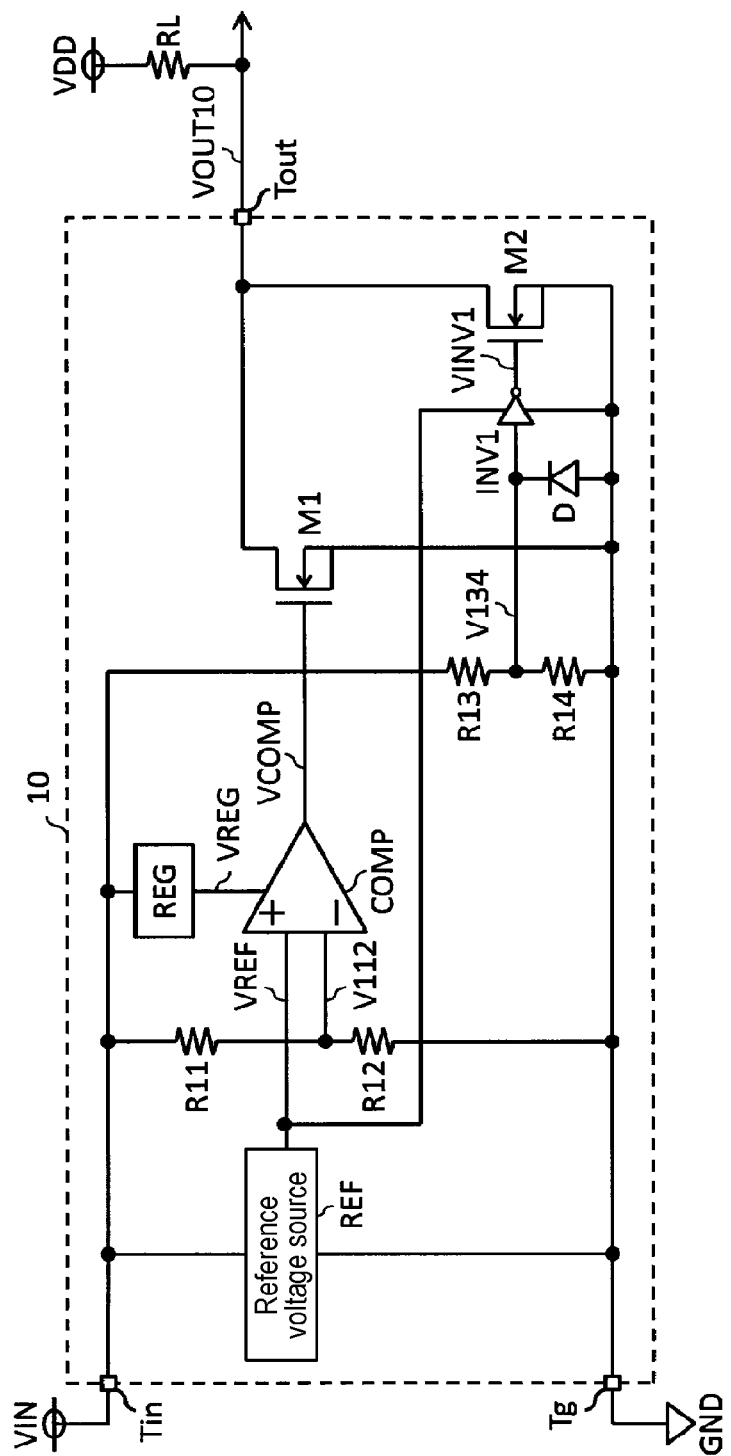
FIG. 1 is a circuit diagram showing a power supply voltage monitoring circuit according to a first embodiment of the present disclosure.

FIG. 1 shows a power supply voltage monitoring circuit according to a first embodiment of the present disclosure. The power supply voltage monitoring circuit 10 has an input terminal Tin, an output terminal Tout, and a ground terminal Tg. The input terminal Tin is connected to a power supply voltage VIN. The output terminal Tout is pulled up to a pull-up voltage VDD via a pull-up resistor RL. The ground terminal Tg is connected to the ground potential GND. Therefore, when the power supply voltage VIN applied to the input terminal Tin is higher or lower than a predetermined voltage, the power supply voltage monitoring circuit 10 outputs a power supply voltage monitoring output signal VOUT10 from the output terminal Tout. The power supply voltage monitoring output signal VOUT10 is used as, for example, an enable signal and a disable signal of a CPU or DSP (not shown). The power supply voltage VIN is, for example, 0 to 60V and may be used as a power supply voltage of the CPU or DSP.

The power supply voltage monitoring circuit 10 includes a reference voltage source REF, a regulator voltage source REG, resistors R11 to R14, a comparator COMP, transistors M1 and M2, an inverter INV1, and a diode. The comparator COMP serves as a first binary converting means according to the present disclosure, and the inverter INV1 and the transistor M2 serve as a second binary converting means according to the present disclosure. In addition, the transistor M1 serves as a first switching means, and the transistor M2 serves as a second switching means.

The reference voltage source REF generates a reference voltage VREF when the power supply voltage VIN exceeds a predetermined value. The reference voltage VREF is, for example, 0.9V to 1.2V and is used as a reference voltage of the comparator COMP and further as a driving voltage of each of an inverter INV1 and a logic circuit LOGIC which will be described later. The reference voltage source REF is configured by a depletion type voltage source, a band gap reference circuit, a linear regulator circuit or the like, the circuit configuration of which will be described later.

The regulator voltage source REG generates a regulator voltage VREG when the power supply voltage VIN exceeds the predetermined value. The regulator voltage VREG is, for example, 3V to 5V, which is higher than the reference voltage VREF, which is, for example, 0.9V to 1.2V. The regulator voltage VREG is a driving voltage of the comparator COMP and is determined by the circuit configuration of the comparator COMP. When the comparator COMP can be configured by a low voltage element, it is also possible to reduce the regulator voltage VREG to be 3V or less. A specific circuit configuration of the regulator voltage source REG can adopt any one of a linear regulator, a depletion type voltage source, and a band gap reference circuit, as described above, but the linear regulator may be used to generate the regulator voltage VREG higher than the reference voltage VREF in some embodiments.

The resistors R11 and R12 are connected in series in this order between the input terminal Tin and the ground terminal Tg. Therefore, the resistors R11 to R12 constitute a voltage dividing circuit that generates a predetermined divided voltage from the power supply voltage VIN. The divided voltage V112 output from the connection point between the resistor R11 and the resistor R12 is VIN·R12/(R11+R12), which is applied to the inverting input terminal (−) of the comparator COMP.

The comparator COMP serves as the first binary converting means. Therefore, the comparator COMP compares the divided voltage V112 applied to the inverting input terminal (−) with the reference voltage VREF applied to the non-inverting input terminal (+), and outputs a first binary output signal (comparator output signal) VCOMP having two values of a high level to be output in the case of VREF>V112 and a low level to be output when VREF<V112. The comparator output signal VCOMP is one of monitoring signals indicating whether the power supply voltage VIN is higher or lower than a predetermined voltage.

The comparator output signal VCOMP output from the comparator COMP is applied to a gate of the transistor M1 constituting the first switching means. The transistor M1 includes, for example, an NMOS transistor. A drain of the transistor M1 is connected to the output terminal Tout and a source thereof is connected to the ground terminal Tg. Therefore, a main conductive path of the transistor M1 is connected between the output terminal Tout and the ground terminal Tg. Note that a bipolar type NPN transistor, in place of the NMOS transistor, may be used as the transistor M1.

Here, ideal input/output characteristics of the power supply voltage monitoring circuit 10 according to the present disclosure, that is, a relationship between the power supply voltage VIN and the output voltage VOUT10 (power supply voltage monitoring output signal), will be described. It is assumed that the output voltage VOUT10 is always at a low level when the power supply voltage VIN is relatively low. In the power supply voltage monitoring circuit 10, when the power supply voltage VIN is relatively low, since the reference voltage VREF is higher than the divided voltage V112, the comparator output signal VCOMP of the comparator COMP has a high level. Therefore, since the output voltage VOUT10 is at the low level, the power supply voltage monitoring circuit 10 meets the ideal input/output characteristics, which seems that there is no problem at all.

However, the above-mentioned ideal input/output characteristics can be obtained, based on the assumption that the comparator COMP performs a normal circuit operation even when the power supply voltage VIN is relatively low. However, in reality, since the regulator voltage VREG, which is the driving voltage of the comparator COMP, is generated based on the power supply voltage VIN, the power supply voltage VIN at which the comparator COMP performs the normal circuit operation has to be relatively high. In order to avoid such a problem, it is sufficient to simplify the circuit configuration of the comparator COMP as much as possible and adopt a so-called low threshold voltage element that can operate at a low voltage. However, when the low voltage element is adopted for the comparator COMP, withstand voltage of the element becomes low such that the element cannot be applied to a high power supply voltage monitoring circuit, which may make it difficult to cover a wide range of power supply voltage.

In order to solve such a problem, the power supply voltage monitoring circuit according to the first embodiment of the present disclosure includes the transistor M2, the inverter INV1, and resistors R13 and R14. The drain of the transistor M2 is connected to the output terminal Tout, and the source thereof is connected to the ground terminal Tg. Therefore, the main conduction path of transistor M 2 is connected in parallel with that of the transistor M1. The transistor M2 is, for example, an NMOS transistor like the transistor M1.

Like the resistors R11 and R12, the resistors R13 and R14 constitute a voltage dividing circuit that generates a predetermined voltage from the power supply voltage VIN. One end of the resistor R13 is connected to the input terminal Tin, and the other end thereof is connected to one end of the resistor R14. The other end of the resistor R14 is connected to the ground terminal Tg. A divided voltage V134 is generated at the connection point between the resistor R13 and the resistor R14. The divided voltage V134 is input to the input side of the inverter INV1 using the reference voltage VREF, which is a relatively low voltage source, as a driving voltage. The divided voltage V134 is set to be higher than the divided voltage V112 applied to the inverting input terminal (−) of the comparator COMP. Therefore, transition of the power supply voltage VIN can be detected by the inverter INV1 in the range of the power supply voltage VIN, which is lower than the power supply voltage VIN at which the comparator COMP normally operates. Since the inverter INV1 driven by a comparatively low voltage source operates at a lower power supply voltage than the voltage for the operation of the comparator COMP, the output voltage VINV1 of the inverter INV1 can be maintained at a high level, and the potential of the output terminal Tout can be maintained at a target low level L even when the power supply voltage VIN is at a low level. That is, since the transistor M2 can be turned on before the transistor M1 is turned on, the output terminal Tout can be maintained at the target low level.

The diode D is used to clamp the divided voltage V134, that is, the voltage applied to the input side of the inverter INV1 when it is likely that the divided voltage V134 rises to exceed the withstand voltage of the inverter INV1, as the power supply voltage VIN rises. Therefore, in a case where such a problem does not occur or a countermeasure has already been taken, the diode D is not an essential constitutional requirement. The anode and the cathode of the diode D are connected to the ground terminal Tg and the input side of the inverter INV1, respectively.

One of the features of the power supply voltage monitoring circuit 10 is that, when outputting the power supply voltage monitoring output signal VOUT10 to the output terminal Tout, the drain as an output of the transistor M1 constituting the first switching means and the drain of the transistor M2 constituting the second switching means are connected in common inside the power supply voltage monitoring circuit 10 to constitute a wired OR (negative logic) circuit. Further, since the second switching means has a circuit configuration to operate with a power supply voltage lower than the power supply voltage at which the first switching means operates, it is possible to realize an operation at a power supply voltage lower than that in a system that outputs the power supply voltage monitoring output signal from the output of the comparator COMP.

Figure 2:
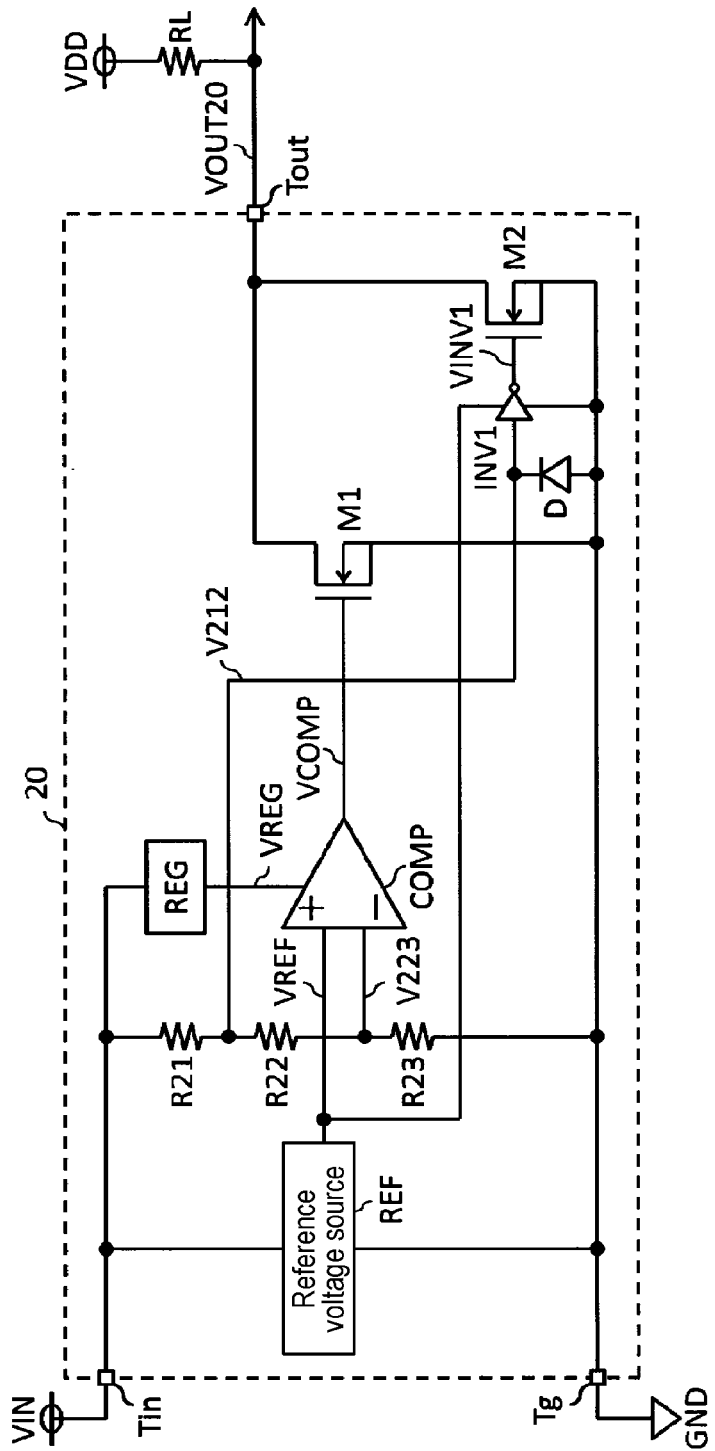
FIG. 2 is a circuit diagram showing a power supply voltage monitoring circuit according to a second embodiment of the present disclosure.

FIG. 2 is a circuit diagram showing a power supply voltage monitoring circuit according to a second embodiment of the present disclosure. The difference between the power supply voltage monitoring circuit 20 and the power supply voltage monitoring circuit 10 of FIG. 1 lies in a part for generating a divided voltage to be applied to the comparator COMP and the input side of the inverter INV1.

That is, the power supply voltage monitoring circuit 20 constitutes a voltage dividing circuit by connecting resistors R21, R22, and R23 in series in this order between the input terminal Tin and the ground terminal Tg. That is, divided voltages to be input to the comparator COMP and the inverter INV1 are generated by three resistors. In other words, a divided voltage to be input to the input side of the inverter INV1 and a divided voltage to be input to one input terminal of the comparator COMP are generated by one voltage dividing circuit. A divided voltage V212 generated at the connection point between the resistors R21 and R22 is input to the input side of the inverter INV1 and a divided voltage V223 generated at the connection point between the resistors R22 and R23 is input to the inverting input terminal (−) of the comparator COMP. It is important as described above to select the divided voltage V223 higher than the divided voltage V212. With such a circuit configuration, it is possible to simplify the circuit configuration and enhance the accuracy of the relative ratio between the divided voltages V212 and V223. Since the other circuit configurations are the same as those of the power supply voltage monitoring circuit 10 of FIG. 1, detailed explanation thereof will be omitted.

Figure 3:
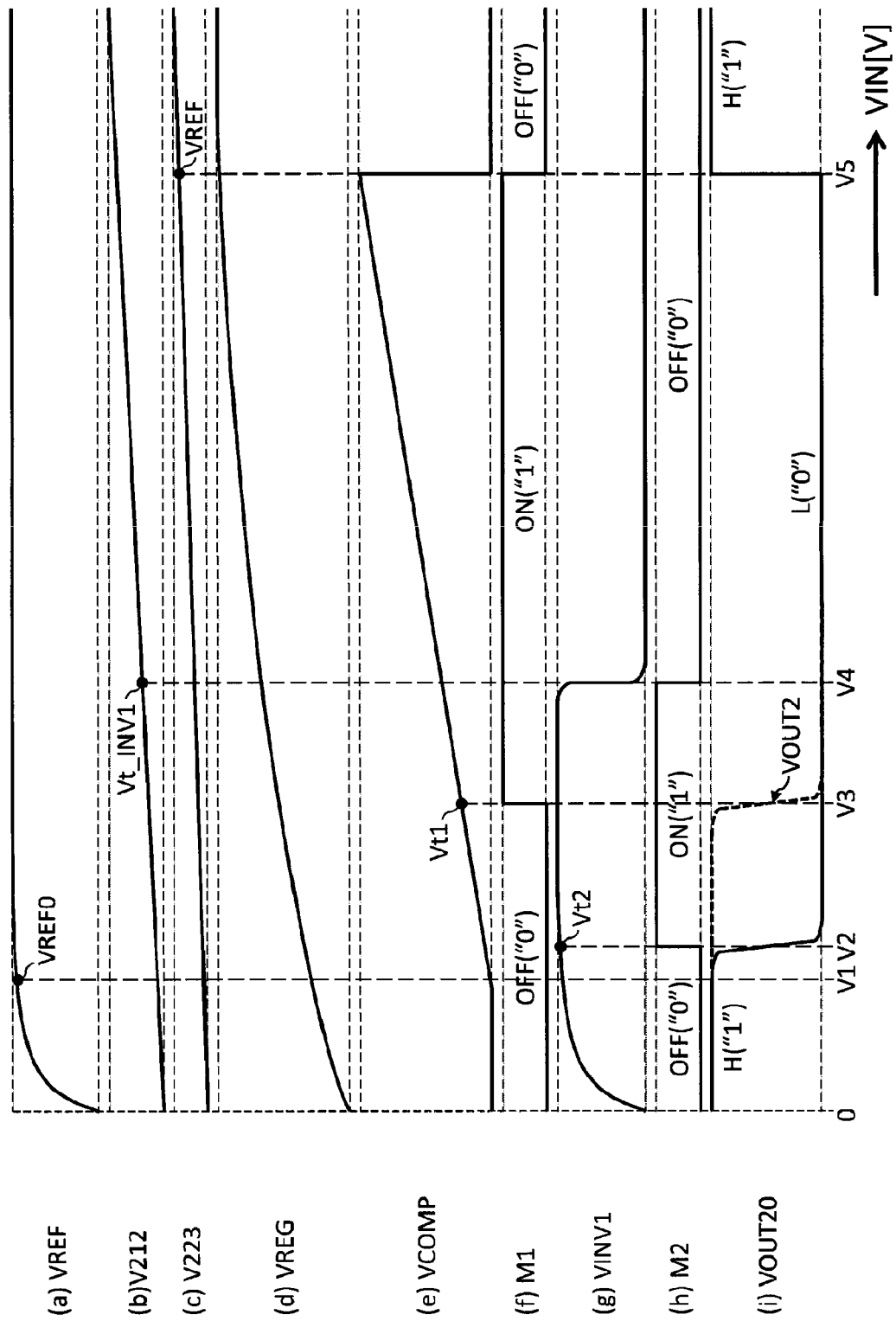
FIG. 3 is a timing chart of the power supply voltage monitoring circuit of FIG. 2.

FIG. 3 is a timing chart of the power supply voltage monitoring circuit of FIG. 2. The vertical axis schematically represents signals and voltages of main nodes. The horizontal axis represents the transition of the power supply voltage VIN rising from right to left.

Here, voltages V1 to V5 representing predetermined voltages of the power supply voltage VIN will be described. The voltage V1 corresponds to a power supply voltage VIN when the reference voltage VREF reaches a stabilized voltage VREF0. The voltage V2 corresponds to a power supply voltage VIN when the inverter output signal VINV1 of the inverter INV1 reaches a threshold voltage Vt2 of the transistor M2, that is, when the transistor M2 transitions from turn-off to turn-on. Therefore, the voltage V2 corresponds to a power supply voltage VIN when a power supply voltage monitoring output signal VOUT20 transitions from high level H to low level L. The voltage V3 corresponds to a power supply voltage VIN when the comparator output signal VCOMP of the comparator COMP reaches a threshold voltage Vt1 of the transistor M1, that is, when the transistor M1 transitions from turn-off to turn-on. The voltage V4 corresponds to a power supply voltage VIN when the divided voltage V212 reaches a threshold voltage Vt_INV1 of the inverter INV1, that is, when the output signal VINV1 of the inverter INV1 transitions from high level to low level. Therefore, the voltage V4 also corresponds to a power supply voltage VIN when the transistor M2 transitions from turn-on to turn-off. The voltage V5 corresponds to a power supply voltage VIN when the divided voltage V223 reaches the reference voltage VREF, that is, when the comparator output signal VCOMP of the comparator COMP transitions from high level to low level. Therefore, the voltage V5 also corresponds to a power supply voltage VIN when the transistor M1 transitions from turn-on to turn-off, that is, when the power supply voltage monitoring output signal VOUT20 transitions from low level L to high level H.

(a) VREF denotes the reference voltage generated by the reference voltage source REF. The reference voltage VREF is generated based on the power supply voltage VIN, but it may be generated as a relatively low voltage of 0.9V to 1.2V, for example by using a depletion type voltage source or a band gap reference circuit as the reference voltage source REF. That is, even when the power supply voltage VIN is relatively low, it can be maintained at a stable desired level. In (a) of FIG. 3, the symbol VREF0 indicates a state in which the power supply voltage VIN has already reached a predetermined magnitude of 0.9V to 1.2V at a power supply voltage lower than the voltage V2. With such a setting, the circuit operation of the inverter INV1 can be executed with a relatively low power supply voltage. The same applies to FIGS. 5 and 7 to be described later.

(b) V212 denotes a divided voltage output from the connection point between the resistors R21 and R22 and is applied to the input side of the inverter INV1. The divided voltage V212 is VIN·(R22+R23)/(R21+R22+R23) and increases in proportion to the magnitude of the power supply voltage VIN. The symbol Vt_INV1 indicates the threshold voltage of inverter INV1.

(c) V223 is a divided voltage output from the connection point between the resistors R22 and R23 and is applied to the inverting input terminal (−) of the comparator COMP. The divided voltage V223 is VIN·R23/(R21+R22+R23) and increases in proportion to the magnitude of the power supply voltage VIN. The rising slope of the divided voltage V223 is gentler than the rising slope of the divided voltage V212.

(d) VREG denotes a regulator voltage generated by the regulator voltage source REG. The regulator voltage VREG rises later than the above-mentioned reference voltage VREF. The magnitude of the regulator voltage VREG is maintained at about 3.0V, for example, when the power supply voltage VIN reaches, for example, 3.5V or higher as indicated by V5. However, the reference voltage VREF is maintained at a stable level of approximately 0.9V when the power supply voltage VIN reaches approximately 1.2V. Therefore, the power supply voltage VIN at which the regulator voltage is stabilized becomes higher than the power supply voltage VIN at which the reference voltage VREF is stabilized.

(e) VCOMP denotes a comparator output signal generated by the comparator COMP. The comparator output signal VCOMP is a comparison result obtained by comparing the reference voltage VREF and the divided voltage V223. Therefore, the comparator output signal VCOMP has a high level in a period where the reference voltage VREF is higher than the divided voltage V223 (power supply voltage VIN≤V5), and has a low level in a period where the reference voltage VREF is lower than the divided voltage V223 (power supply voltage VIN≥V5). Since the driving voltage source of the comparator COMP is the regulator voltage VREG, the magnitude of the high level of the comparator output signal VCOMP1 linearly increases following the regulator voltage VREG.

(f) M1 denotes the turn-on/off state of the transistor M1. The turn-on/off state of the transistor M1 depends on the comparator output signal VCOMP applied to the gate of the transistor M1. Therefore, the transistor M1 is turned on in a period where the comparator output signal VCOMP is higher than the threshold voltage Vt1 of the transistor M1 (power supply voltage V3≤VIN≤V5), and is turned off in a period where the comparator output signal VCOMP is lower than the threshold voltage Vt1 of the transistor M1 (power supply voltage VIN≤V3, VIN≥V5).

(g) VINV1 denotes an inverter output voltage generated by the inverter INV1. The inverter output voltage VINV1 depends on the divided voltage V212 and the threshold voltage Vt_INV1 of the inverter INV1. Therefore, the inverter output voltage VINV1 has a high level in a period where the divided voltage V212 is lower than the threshold voltage Vt_INV1 of the inverter INV1 (power supply voltage VIN≤V4), and has a low level in a period where the divided voltage V212 is higher than the threshold voltage Vt_INV1 of the inverter INV1 (power supply voltage VIN≥V4).

(h) M2 denotes the turn-on/off state of the transistor M2. The turn-on/off state of the transistor M2 depends on the inverter output voltage VINV1 applied to the gate of the transistor M2. Therefore, the transistor M2 is turned on in a period where the inverter output voltage VINV1 is higher than the threshold voltage Vt2 of the transistor M2 (power supply voltage V1≤VIN≤V4), and is turned off in a period where the inverter output voltage VINV1 is lower than the threshold voltage Vt2 of the transistor M2 (power supply voltage VIN≤V1, VIN≥V4).

(i) VOUT20 denotes an output voltage output from the output terminal Tout and also denotes a power supply voltage monitoring output signal indicating whether the power supply voltage VIN is higher or lower than a predetermined voltage. The power supply voltage monitoring output signal VOUT20 (indicated by a solid line) shows the characteristics of the power supply voltage monitoring circuit 20 according to the present disclosure, and the power supply voltage monitoring output signal VOUT (indicated by a broken line) shows the characteristics of the conventional power supply voltage monitoring circuit. In the power supply voltage monitoring circuit, the lower the power supply voltage VIN when the power supply voltage monitoring output signals VOUT20 and VOUT transition from high level H to low level L, the better it is for low power supply voltage applications.

The power supply voltage monitoring output signal VOUT20 (indicated by a solid line) is generated by the turn-on/off of the transistors M1 and M2. Therefore, the power supply voltage monitoring output signal VOUT20 has a low level L (ground potential GND) in a period where at least one of the transistors M1 and M2 is turned on (power supply voltage V2≤VIN≤V5), and has a high level H (pull-up voltage VDD) in a period where both of the transistors M1 and M2 are turned off (power supply voltage VIN≤V2, VIN≥V5). In other words, the power supply voltage monitoring output signal VOUT20 is generated by the NOR operation of the transistor M1 and the transistor M2. Supposing that the turn-on state of the transistors M1 and M2 has a logic value "1" and the turn-off state of the transistors M1 and M2 has a logic value "0," the power supply voltage monitoring output signal VOUT20 has a logic value "0" indicating a low level L when the logic value of at least one of the transistors M1 and M2 is "1," and has a logic value "1" indicating a high level H when the logic value of both of the transistors M1 and M2 is "0." The power supply voltage monitoring circuit 20 can transition the power supply voltage monitoring output signal VOUT20 from high level H to low level L by the transistor M2 and the inverter INV1 even when the power supply voltage VIN is the relatively low voltage V2.

The power supply voltage monitoring output signal VOUT (indicated by a broken line) shows a case where the power supply voltage monitoring circuit 10 of FIG. 1 and the power supply voltage monitoring circuit 20 of FIG. 2 do not include the transistor M2 and the inverter INV1 and generate a power supply voltage monitoring output signal based on the circuit operation of the comparator COMP and the transistor M1. The power supply voltage monitoring output signal VOUT is generated by the turn-on/off of the transistor M1. Therefore, the power supply voltage monitoring output signal VOUT has a low level L in a period where the transistor M1 is turned on (the power supply voltage V3≤VIN≤V5), and has a high level H in a period where the transistor M1 is turned off (the power supply voltage VIN≤V3, VIN≥V5). Since the power supply voltage VIN when the power supply voltage monitoring output signal VOUT transitions from high level H to low level L is the voltage V3 which is higher than the voltage V2, it cannot be said that the conventional power supply voltage monitoring circuit is necessarily suitable for low power supply voltage applications.

As apparent from the above description, the power supply voltage monitoring circuits 10 and 20 according to the present disclosure are suitable for low power supply voltage applications as compared with the conventional power supply voltage monitoring circuit.

Third Embodiment

Figure 4:
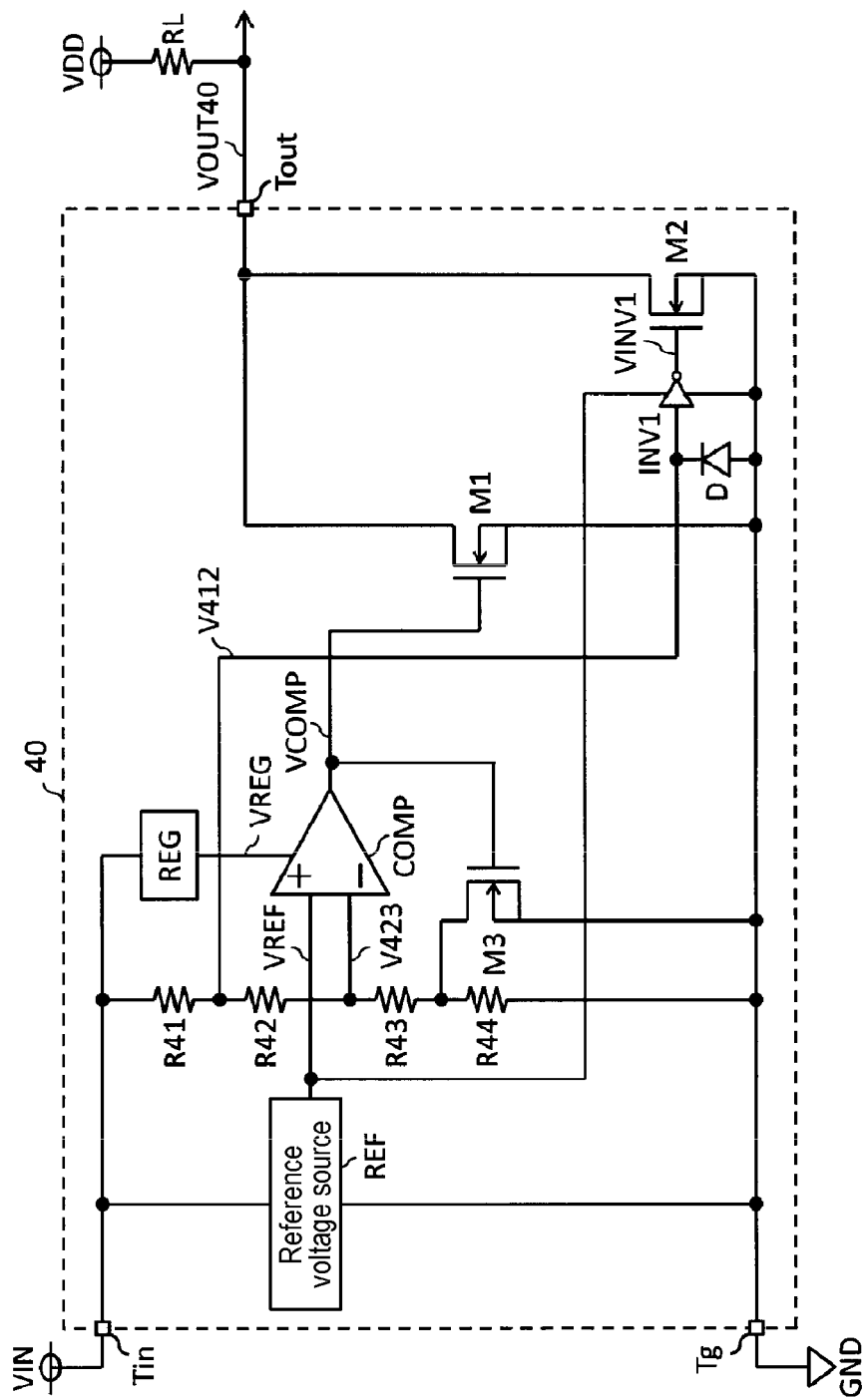
FIG. 4 is a circuit diagram showing a power supply voltage monitoring circuit according to a third embodiment of the present disclosure.

FIG. 4 is a circuit diagram showing a power supply voltage monitoring circuit according to a third embodiment of the present disclosure. The power supply voltage monitoring circuit 40 is different from the power supply voltage monitoring circuit 20 in FIG. 2 in that the three resistors R21 to R23 constituting the bias voltage generation circuit of the power supply voltage monitoring circuit 20 are replaced with four resistors R41 to R44 and a transistor M3 is further added. Since other circuit configurations are the same, different points will be described here.

The power supply voltage monitoring circuit 40 includes the resistors R41, R42, R43, and R44 connected in series in this order between the input terminal Tin and the ground terminal Tg. The transistor M3 is an NMOS transistor and the drain of the transistor M3 is connected to the common connection point between the resistors R43 and R44. The source of the transistor M3 is connected to the ground terminal Tg. The gate of the transistor M3 is connected to the output of the comparator COMP. The transistor M3 is turned on or off by the comparator output signal VCOMP of the comparator COMP. The potential of the inverting input terminal (−) of the comparator COMP is switched by the turn-on/off of the transistor M3, and the so-called hysteresis characteristic that the comparison potential with the reference voltage VREF is switched is applied to the comparator COMP. In such a power supply voltage monitoring circuit, it is well known that the comparator COMP has the hysteresis characteristic to stabilize the power supply voltage monitoring output signal VOUT40, as known well in the related art. Therefore, detailed explanation of the hysteresis characteristic is omitted.

A divided voltage V412 applied to the input side of the inverter INV1 when the transistor M3 is turned off is VIN·(R42+R43+R44)/(R41+R42+R43+R44). On the other hand, when the transistor M3 is turned on, the divided voltage V412 is VIN·(R42+R43)/(R41+R42+R43).

A divided voltage V423 applied to the inverting input terminal (−) of the comparator COMP when the transistor M3 is turned off is VIN·(R43+R44)/(R41+R42+R43+R44). On the other hand, when the transistor M3 is turned on, the divided voltage V423 is VIN·R43/(R41+R42+R43).

Figure 5:
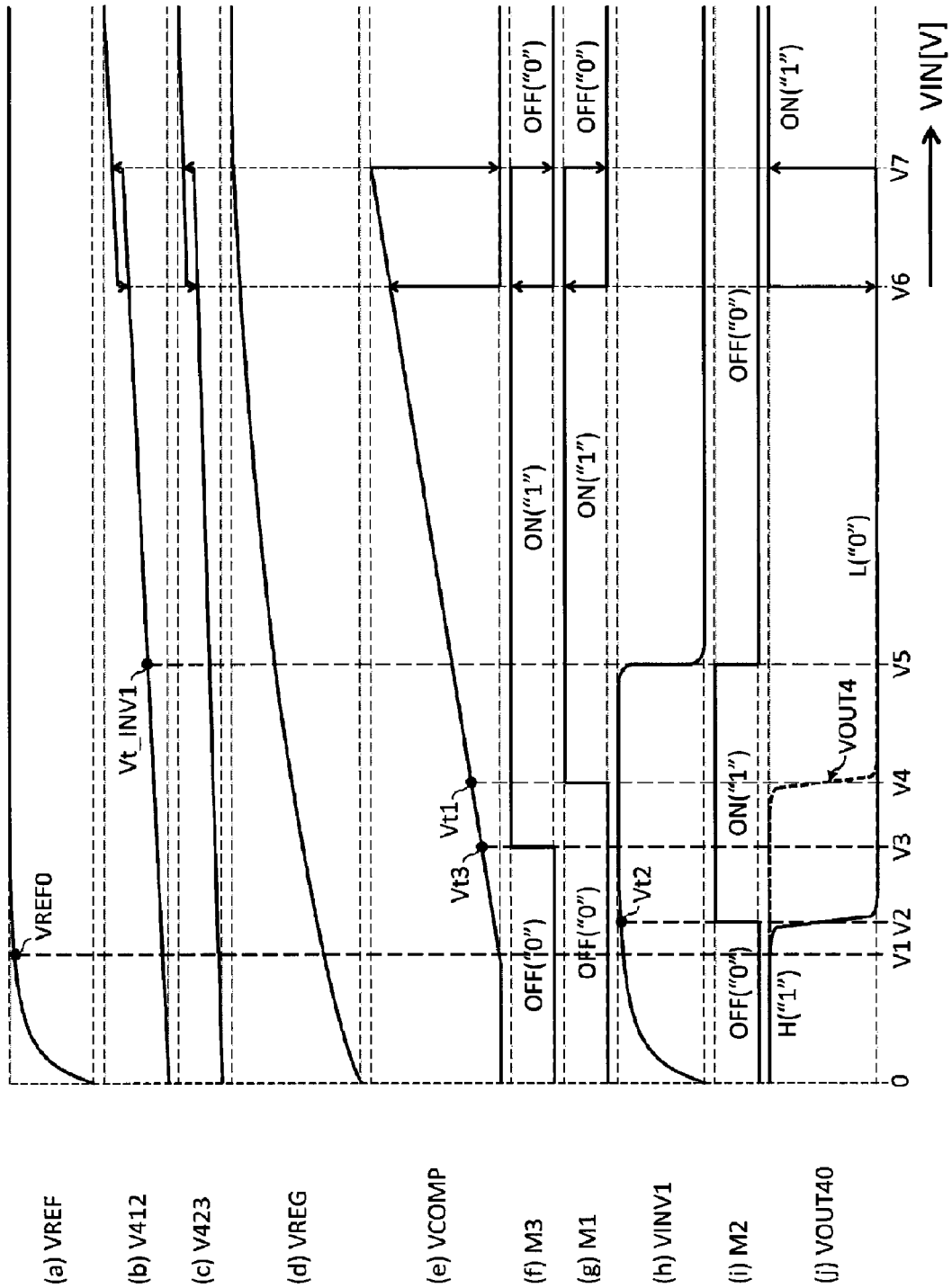
FIG. 5 is a timing chart of the power supply voltage monitoring circuit of FIG. 4.

FIG. 5 is a timing chart of the power supply voltage monitoring circuit of FIG. 4. The vertical axis schematically represents signals and voltages of the main nodes. The horizontal axis represents the transition of the power supply voltage VIN rising from right to left. Since (a), (d), (h), and (i) of FIG. 5 are not affected by the hysteresis function and are the same as (a), (d), (g), and (h) of FIG. 3, respectively, detailed explanation thereof will be omitted.

Here, voltages V1 to V7 representing predetermined voltages of the power supply voltage VIN will be described. Since the voltages V1, V2, V4, and V5 of FIG. 5 are the same as the voltages V1, V2, V3, and V4 of FIG. 3, respectively, detailed explanation thereof will be omitted. The voltage V3 corresponds to a power supply voltage VIN when the comparator output signal VCOMP of the comparator COMP reaches a threshold voltage Vt3 of the transistor M3, that is, when the transistor M3 switches from turn-off to turn-on. The voltage V6 corresponds to a power supply voltage VIN when a hysteresis voltage reaches the lower limit value. The voltage V7 corresponds to a power supply voltage VIN when the hysteresis voltage reaches the upper limit value.

(b) V412 denotes a divided voltage output from the connection point between the resistor R41 and the resistor R42 and is applied to the input side of the inverter INV1. The divided voltage V412 depends on the turn-on/off state of the transistor M3. Therefore, the divided voltage V412 is VIN·(R42+R43)/(R41+R42+R43) when the transistor M3 is turned on, and is VIN·(R42+R43+R44)/(R41+R42+R43+R44) when it is turned off. The width of these two values is a so-called hysteresis width.

(c) V423 denotes a divided voltage output from the connection point between the resistor R42 and the resistor R43 and is applied to the inverting input terminal (−) of the comparator COMP. Like the divided voltage V412, the divided voltage V423 depends on the turn-on/off state of the transistor M3. Therefore, the divided voltage V423 is VIN·R43/(R41+R42+R43) when the transistor M3 is turned on, and is VIN·(R43+R44)/(R41+R42+R43+R44) when it is turned off.

(e) VCOMP denotes a comparator output signal generated by the comparator COMP.

The comparator output signal VCOMP is a comparison result obtained by comparing the reference voltage VREF and the divided voltage V423. Therefore, the comparator output signal VCOMP has a high level in a period where the reference voltage VREF is higher than the divided voltage V423, and has a low level in a period where the reference voltage VREF is lower than the divided voltage V423. As described above, the divided voltage V423 takes two values according to the turn-on/off state of the transistor M3. In the rising of the power supply voltage VIN, when the supply voltage VIN reaches the voltage V7, that is, a power supply voltage when the reference voltage VREF reaches the divided voltage V423 (=VIN·R43/(R41+R42+R43)), the comparator output signal VCOMP transitions from high level to low level. When the power supply voltage VIN switches from rising to falling and reaches the voltage V6, that is, a power supply voltage when the reference voltage VREF reaches the divided voltage V423 (=VIN·(R3+R4)/(R1+R2+R3+R4)), the comparator output signal VCOMP transitions from low level to high level. Therefore, when the power supply voltage VIN changes from rising to falling, a state that the comparator output signal VCOMP transitions to the voltage V6 lower than the voltage V7 instead of the voltage V7 is the hysteresis characteristic. Since the driving voltage source of the comparator COMP is the regulator voltage VREG, the magnitude of the high level of the comparator output signal VCOMP1 linearly increases following the regulator voltage VREG.

(f) M3 denotes the turn-on/off state of the transistor M3. The turn-on/off state of the transistor M3 depends on the comparator output signal VCOMP applied to the gate of the transistor M3. Therefore, the transistor M3 is turned on in a period where the comparator output signal VCOMP is higher than the threshold voltage Vt3 of the transistor M3, and is turned off in a period where the comparator output signal VCOMP is lower than the threshold voltage Vt3 of the transistor M3. In the rising of the power supply voltage VIN, when the power supply voltage VIN reaches the voltage V3, that is, a power supply voltage when the comparator output signal VCOMP reaches the threshold voltage Vt3 of the transistor M3, the transistor M3 transitions from turn-off to turn-on. Further, in the rising of the power supply voltage VIN, when the power supply voltage VIN reaches the voltage V7, that is, a power supply voltage when the comparator output signal VCOMP transitions from high level to low level, the transistor M3 transitions from turn-on to turn-off. When the power supply voltage VIN switches from rising to falling and reaches the voltage V6, that is, a voltage when the comparator output signal VCOMP transitions from low level to high level, the transistor M3 transitions from turn-off to turn-on. Further, in the falling of the power supply voltage VIN, when the power supply voltage VIN reaches the voltage V3, the transistor M3 transitions from turn-on to turn-off. Therefore, when the power supply voltage VIN changes from rising to falling, a state that the transistor M3 transitions to the voltage V6 lower than the voltage V7 instead of the voltage V7 is the hysteresis characteristic.

(g) M1 denotes the turn-on/off state of the transistor M1. The turn-on/off state of the transistor M1 depends on the comparator output signal VCOMP applied to the gate of the transistor M1. Therefore, the transistor M1 is turned on in a period where the comparator output signal VCOMP is higher than the threshold voltage Vt1 of the transistor M1, and is turned off in a period where the comparator output signal VCOMP is lower than the threshold voltage Vt1 of the transistor M1. In the rising of the power supply voltage VIN, when the power supply voltage VIN reaches the voltage V4, that is, a power supply voltage when the comparator output signal VCOMP reaches the threshold voltage Vt1 of the transistor M1, the transistor MI transitions from turn-off to turn-on. Further, in the rising of the power supply voltage VIN, when the power supply voltage VIN reaches the voltage V7, that is, a power supply voltage when the comparator output signal VCOMP transitions from high level to low level, the transistor M1 transitions from turn-on to turn-off. When the power supply voltage VIN switches from rising to falling and reaches the voltage V6, that is, a voltage when the comparator output signal VCOMP transitions from low level to high level, the transistor M1 transitions from turn-off to turn-on. Further, in the falling of the power supply voltage VIN, when the power supply voltage VIN reaches the voltage V4, the transistor M1 transitions from turn-on to turn-off. Therefore, when the power supply voltage VIN changes from rising to falling, a state that the transistor M1 transitions to the voltage V6 lower than the voltage V7 instead of the voltage V7 is the hysteresis characteristic.

(j) VOUT40 denotes an output voltage output from the output terminal Tout and also denotes a power supply voltage monitoring output signal indicating whether the power supply voltage VIN is higher or lower than a predetermined voltage. The power supply voltage monitoring output signal VOUT40 (indicated by a solid line) shows the characteristics of the power supply voltage monitoring circuit 40 according to the present disclosure, and the power supply voltage monitoring output signal VOUT (indicated by a broken line) shows the characteristics of the conventional power supply voltage monitoring circuit. Unlike the power supply voltage monitoring output signal VOUT20 of FIG. 3, the power supply voltage monitoring output signal VOUT40 has the hysteresis characteristic. In the power supply voltage monitoring circuit, the lower the power supply voltage VIN when the power supply voltage monitoring output signals VOUT40 and VOUT transition from high level H to low level L, the better it is for low power supply voltage applications.

The power supply voltage monitoring output signal VOUT40 (indicated by a solid line) is generated by the turn-on/off of the transistors M1 and M2. Therefore, the power supply voltage monitoring output signal VOUT40 has a low level L (ground potential GND) in a period where at least one of the transistors M1 and M2 is turned on, and has a high level H (pull-up voltage VDD) in a period where both of the transistors M1 and M2 are turned off. In the rising of the power supply voltage VIN, when the power supply voltage VIN reaches the voltage V2, that is, a power supply voltage when the transistor M2 transitions from turn-off to turn-on, the power supply voltage monitoring output signal VOUT40 transitions from high level H to low level L. Further, in the rising of the power supply voltage VIN, when the power supply voltage VIN reaches the voltage V7, that is, a power supply voltage when both of the transistors M1 and M2 are turned off, the power supply voltage monitoring output signal VOUT40 transitions from low level L to high level H. When the power supply voltage VIN switches from rising to falling and reaches the voltage V6, that is, a power supply voltage when the transistor M1 transitions from turn-off to turn-on, the power supply voltage monitoring output signal VOUT40 transitions from high level H to low level L. Further, in the falling of the power supply voltage VIN, when the power supply voltage VIN reaches the voltage V2, the power supply voltage monitoring output signal VOU40 transitions from low level L to high level H.

In other words, the power supply voltage monitoring output signal VOUT40 is generated by the NOR operation of the transistor M1 and the transistor M2. Supposing that the turn-on state of the transistors M1 and M2 has a logic value "1" and the turn-off state of the transistors M1 and M2 has a logic value "0," the power supply voltage monitoring output signal VOUT40 has a logic value "0" indicating a low level L when the logic value of at least one of the transistors M1 and M2 is "1," and has a logic value "1" indicating a high level H when the logic value of both of the transistors M1 and M2 is "0." The power supply voltage monitoring circuit 40 can transition the power supply voltage monitoring output signal VOUT40 from high level H to low level L by the transistor M2 and the inverter INV1 even when the power supply voltage VIN is the relatively low voltage V2.

The power supply voltage monitoring output signal VOUT (indicated by a broken line) shows the characteristics of the conventional power supply voltage monitoring circuit having the hysteresis characteristic. The power supply voltage monitoring output signal VOUT is generated by the turn-on/off of the transistor M1. Therefore, the power supply voltage monitoring output signal VOUT has a low level L (ground potential GND) in a period where the transistor M1 is turned on, and has a high level H (pull-up voltage VDD) in a period where the transistor M1 is turned off. In the rising of the power supply voltage VIN, when the power supply voltage VIN reaches the voltage V4, that is, a power supply voltage when the transistor M1 transitions from turn-off to turn-on, the power supply voltage monitoring output signal VOUT transitions from high level H to low level L. Further, in the rising of the power supply voltage VIN, when the power supply voltage VIN reaches the voltage V7, that is, a power supply voltage when the transistor M1 is turned off, the power supply voltage monitoring output signal VOUT transitions from low level L to high level H. When the power supply voltage VIN switches from rising to falling and reaches the voltage V6, that is, a power supply voltage when the transistor M1 transitions from turn-off to turn-on, the power supply voltage monitoring output signal VOUT transitions from high level H to low level L. Further, in the falling of the power supply voltage VIN, when the power supply voltage VIN reaches the voltage V4, the power supply voltage monitoring output signal VOUT transitions from low level L to high level H.

As apparent from the above description, the power supply voltage monitoring circuit 40 according to the present disclosure has the same effects as the power supply voltage monitoring circuit 10 of FIG. 1 and the power supply voltage monitoring circuit 20 of FIG. 2.

Fourth Embodiment

Figure 6:
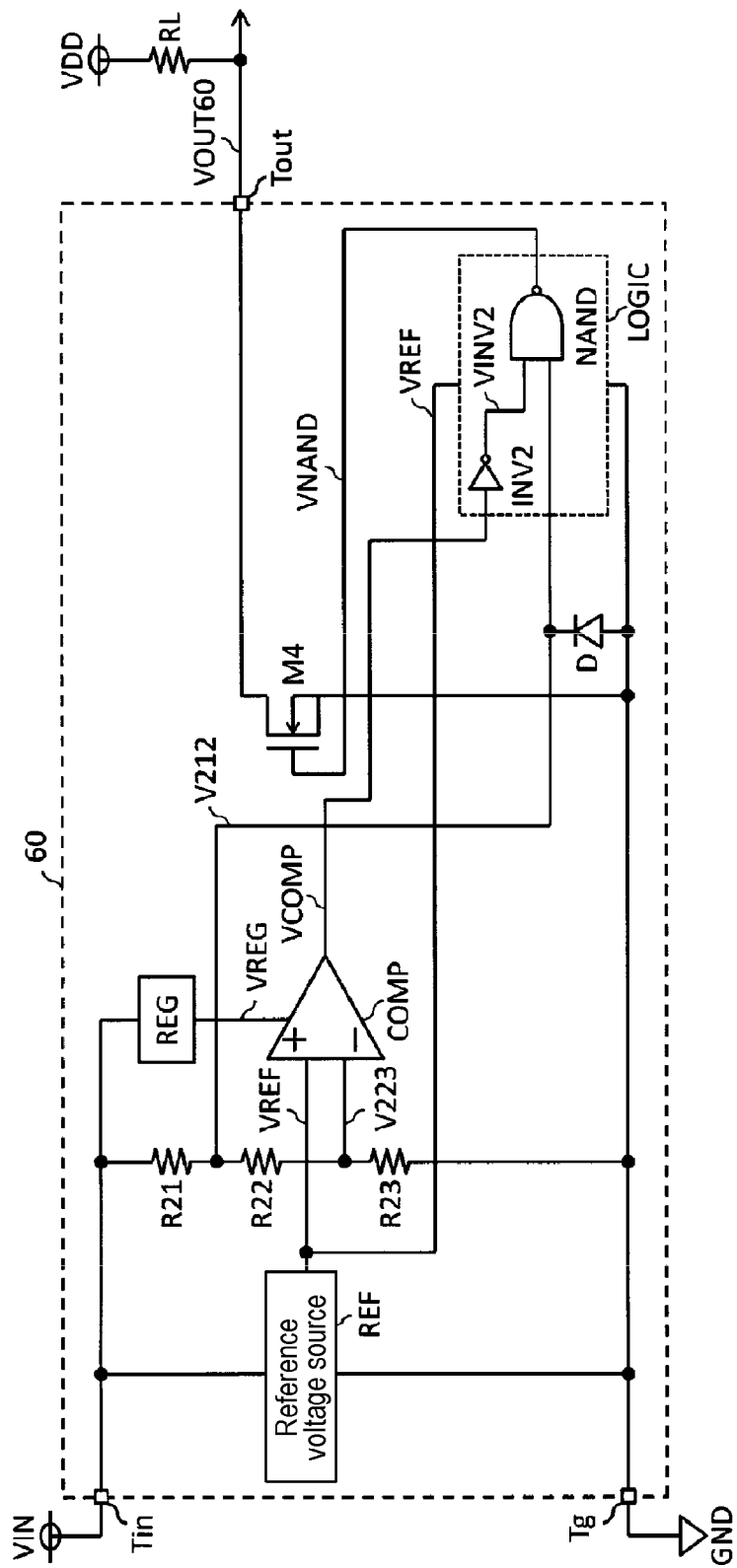
FIG. 6 is a circuit diagram showing a power supply voltage monitoring circuit according to a fourth embodiment of the present disclosure.

FIG. 6 is a circuit diagram showing a power supply voltage monitoring circuit according to a fourth embodiment of the present disclosure. Unlike the power supply voltage monitoring circuit 20 of FIG. 2, the power supply voltage monitoring circuit 60 according to the fourth embodiment does not include the transistor M2 but has a logic circuit LOGIC. The logic circuit LOGIC corresponds to the second binary converting means according to the present disclosure. The logic circuit LOGIC is also a means for generating a second binary signal therein and performing a logical operation based on the first binary signal (VCOMP) and the second binary signal. The logic circuit LOGIC includes, for example, a NAND circuit NAND and an inverter INV2. As the driving voltage of the logic circuit LOGIC, the reference voltage VREF generated by the reference voltage source REF is used. Since the reference voltage VREF is generated with the power supply voltage VIN lower than the regulator voltage VREG as described above, a predetermined circuit operation is executed in a region of the power supply voltage VIN lower than the comparator output signal VCOMP. In other words, the normal circuit operation of the logic circuit LOGIC precedes that of the comparator COMP. The logic circuit LOGIC can also be configured by an AND circuit AND. Further, the logic circuit LOGIC may be constituted by a combination of the AND circuit AND with an inverter, an OR circuit, a NOR circuit, or the like (not shown). Since the power supply voltage monitoring circuit 60 of FIG. 6 does not use the transistor M2 having a relatively large physical size shown in FIGS. 1, 2, and 4, it is possible to achieve a reduction in circuit area. FIG. 6 differs from FIG. 2 in terms of the above points. The differences will be described below in more detail.

The comparator output signal VCOMP output from the comparator COMP is applied to the input side of the inverter INV2 prepared for polarity alignment. The output VINV2 of the inverter INV2 is applied to one input terminal of the NAND circuit NAND. The divided voltage V212 generated at the connection point between the resistors R21 and R22 is applied to the other input terminal of the NAND circuit NAND. Since the divided voltage V212 is on the higher potential side than the divided voltage V223, it operates at a power supply voltage lower than the circuit operation of the product of the comparator COMP. As a result, the logical operation of the logic circuit LOGIC can be dominated by the divided voltage V212 instead of the level of the comparator output signal VCOMP. In other words, it is possible to eliminate instability of the circuit operation of the comparator COMP, which may occur at the low power supply voltage VIN.

A transistor M4 is turned on/off by a logical operation output signal VNAND applied to the gate of the transistor M4. The drain of the transistor M4 is connected to the output terminal Tout, and the source thereof is connected to the ground terminal Tg. The transistor M4 is, for example, of an NMOS type, but it may be a bipolar NPN transistor.

Figure 7:
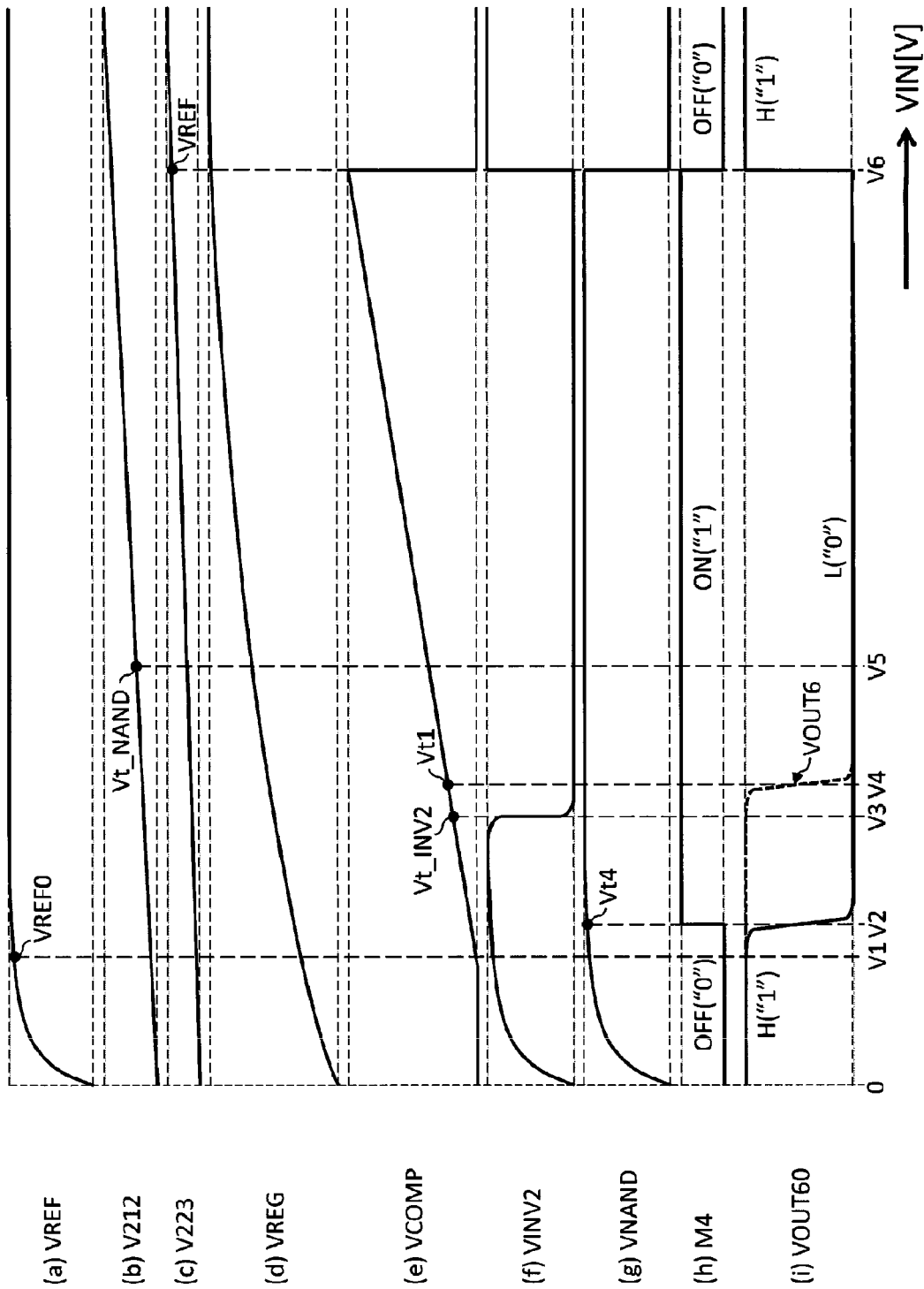
FIG. 7 is a timing chart of the power supply voltage monitoring circuit of FIG. 6.

FIG. 7 is a timing chart of the power supply voltage monitoring circuit of FIG. 6. The vertical axis schematically represents signals and voltages of the main nodes. The horizontal axis represents the transition of the power supply voltage VIN rising from right to left. Since (a), (b), (c), (d), and (e) of FIG. 7 are the same as (a), (b), (c), (d), and (e) of FIG. 3, respectively, regardless of the presence or absence of the logic circuit LOGIC, detailed explanation thereof will be omitted.

Here, voltages V1 to V6 representing predetermined voltages of the power supply voltage VIN will be described. Since the voltages V1, V4, and V6 of FIG. 7 are the same as the voltages V1, V3, and V5 of FIG. 3, respectively, detailed explanation thereof will be omitted. The voltage V2 corresponds to a power supply voltage VIN when the logical operation output signal VNAND of the NAND circuit NAND reaches a threshold voltage Vt4 of the transistor M4, that is, when the transistor M4 transitions from turn-off to turn-on. Therefore, the voltage V2 corresponds to the power supply voltage VIN when the power supply voltage monitoring output signal VOUT60 transitions from high level H to low level L. The voltage V3 corresponds to a power supply voltage VIN when the comparator output signal VCOMP of the comparator COMP reaches the threshold voltage Vt_INV2 of the inverter INV2, that is, when the inverter output signal VINV2 of the inverter INV2 transitions from high level to low level. The voltage V5 corresponds to a power supply voltage VIN when the divided voltage V212 reaches the threshold voltage Vt_NAND of the NAND circuit NAND.

(f) VINV2 denotes an inverter output voltage generated by the inverter INV2. The inverter output voltage VINV2 depends on the comparator output signal VCOMP and the threshold voltage Vt_INV2 of the inverter INV2. Therefore, the inverter output voltage VINV2 has a high level in a period where the comparator output signal VCOMP is lower than the threshold voltage Vt_INV2 of the inverter INV2 (power supply voltage VIN≤V3, VIN≥V6), and has a low level in a period where the comparator output signal VCOMP is higher than the threshold voltage Vt_INV2 of the inverter INV2 (power supply voltage V3≤VIN≤V6).

(g) VNAND denotes a logical operation output signal generated by the NAND circuit NAND. The logical operation output signal VNAND performs a logical operation based on the inverter output voltage VINV2 applied to the first input terminal of the NAND circuit NAND and the divided voltage V212 applied to the second input terminal thereof. Therefore, the logical operation output signal VNAND has a high level in a period where at least one of the inverter output voltage VINV2 equivalent to the first binary output signal VCOMP and the divided voltage V212 is at a low level (VINV6), and has a low level in a period where both of the inverter output voltage VINV2 and the divided voltage V212 are at a high level (VIN≥V6).

(h) M4 denotes the turn-on/off state of the transistor M4. The turn-on/off state of the transistor M4 depends on the logical operation output signal VNAND applied to the gate of the transistor M4. Therefore, the transistor M4 is turned on in a period where the logical operation output signal VNAND is higher than the threshold voltage Vt4 of the transistor M4 (power supply voltage V2≤VIN≤V6), and is turned off in a period where the logical operation output signal VNAND is lower than the threshold voltage Vt4 of the transistor M4 (power supply voltage VIN≤V2, VIN≥V6).

(i) VOUT60 denotes an output voltage output from the output terminal Tout and also denotes a power supply voltage monitoring output signal indicating whether the power supply voltage VIN is higher or lower than a predetermined voltage. The power supply voltage monitoring output signal VOUT60 (indicated by a solid line) shows the characteristics of the power supply voltage monitoring circuit 60 according to the present disclosure, and the power supply voltage monitoring output signal VOUT (indicated by a broken line) shows the characteristics of the conventional power supply voltage monitoring circuit. In the power supply voltage monitoring circuit, the lower the power supply voltage VIN when the power supply voltage monitoring output signals VOUT60 and VOUT transition from high level H to low level L, the better it is for low power supply voltage applications.

The power supply voltage monitoring output signal VOUT60 (indicated by a solid line) is generated by the turn-on/off of the transistor M4. Therefore, the power supply voltage monitoring output signal VOUT60 has a low level L (ground potential GND) in a period where the transistor M4 is turned on (power supply voltage V2≤VIN≤V6), and has a high level H (pull-up voltage VDD) in a period where the transistor M4 is turned off (power supply voltage VIN≤V2, VIN≥V6). Therefore, the power supply voltage monitoring circuit 60 can transition the power supply voltage monitoring output signal VOUT60 from high level H to low level L even when the power supply voltage VIN is the relatively low voltage V2.

Since the power supply voltage monitoring output signal VOUT (indicated by a broken line) is the same as the power supply voltage monitoring output signal VOUT (indicated by a broken line) in FIG. 3, detailed explanation thereof will be omitted.

From the above, the power supply voltage monitoring circuit 60 is more suitable for a low power supply voltage application as compared with the conventional power supply voltage monitoring circuit.

Figure 8:
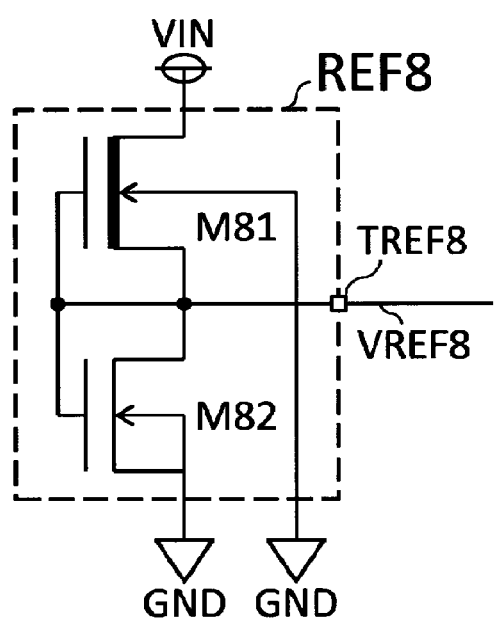
FIG. 8 is a view showing a circuit configuration of a depletion type voltage source used for a reference voltage source or a regulator voltage source according to the present disclosure.

FIG. 8 is a view showing a circuit configuration of a depletion type voltage source used for a reference voltage source or a regulator voltage source according to the present disclosure. A voltage generation circuit REF8 is a depletion type voltage source and has substantially the same configuration as the reference voltage generation circuit known in the related art.

The voltage generation circuit REF8 generates an output voltage VREF8 in response to the input of the power supply voltage VIN and outputs the output voltage VREF8 from an output terminal TREF8. The voltage generation circuit REF8 includes an NMOS depletion type transistor M81 and an NMOS enhancement type transistor M82. The drain of the transistor M81 is connected to the power supply voltage VIN, and the back gate thereof is connected to the ground potential GND. The gate and the source of the transistor M81 are connected in common to the drain and the gate of the transistor M82 and are connected to the output terminal TREF8. The source and the back gate of the transistor M82 are connected to the ground potential GND. The output voltage VREF8 is a difference between the threshold voltage Vt81 of the transistor M81 and the threshold voltage Vt82 of the transistor M82 (that is, VREF8=Vt82−Vt81) and is, for example, 0.5 to 1.5V.

The voltage generation circuit REF8 is suitable for generating a relatively low output voltage. A general voltage generation circuit often adopts a circuit configuration combining an amplifier and a feedback circuit in order to improve accuracy of voltage control. Instead of adopting such a circuit configuration, the voltage generation circuit REF8 adopts a simple circuit configuration that merely connects the depletion type transistor and the enhancement type transistor in series, thereby generating a predetermined output voltage at a high speed even when the power supply voltage VIN is low.

Figure 9:
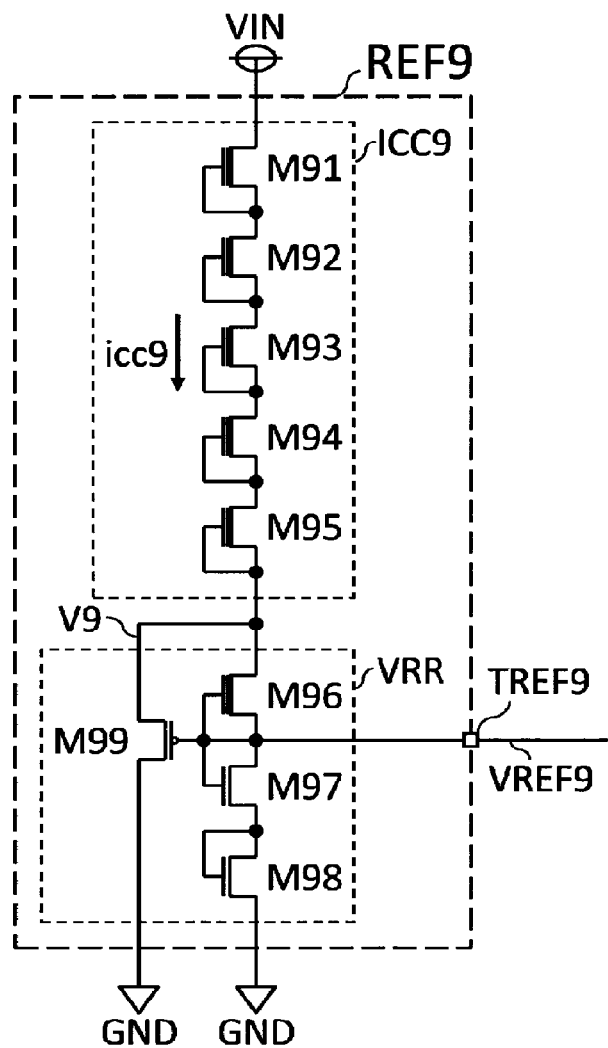
FIG. 9 is a view showing another circuit configuration of the depletion type voltage source used for a reference voltage source or a regulator voltage source according to the present disclosure.

FIG. 9 shows a voltage generation circuit used for the reference voltage source REF or the regulator voltage source REG according to the present disclosure. A voltage generation circuit REF9 has substantially the same configuration as the reference current generation circuit known in the related art.

The voltage generation circuit REF9 generates an output voltage VREF9 in response to the input of the power supply voltage VIN and outputs the output voltage VREF9 from an output terminal TREF9. The voltage generation circuit REF9 includes a current source circuit ICC9 and a voltage source circuit VRR.

The current source circuit ICC9 includes NMOS depletion type transistors M91 to M95. The drain of the transistor M91 is connected to the power supply voltage VIN, and the source and the gate thereof are connected to the drain of the transistor M92. The source and the gate of the transistor M92 are connected to the drain of the transistor M93. The source and the gate of the transistor M93 are connected to the drain of the transistor M94. The source and the gate of the transistor M94 are connected to the drain of the transistor M95. The source and the gate of the transistor M95 are connected to the drain of a transistor M96 and the drain of a transistor M99 of the voltage source circuit VRR.

Although the current source circuit ICC9 is configured by connecting the five transistors M91 to M95 in series, this is merely one embodiment. It is generally known that the withstand voltage of a depletion type MOS transistor cannot be structurally high. For this reason, the current source circuit ICC9 connects the five transistors in series and disperses voltages applied to them to increase the element withstand voltage of the entire current source circuit ICC9. Therefore, the number of stages of transistors used for the current source circuit ICC9 is merely a matter of design, and it may be one or two as long as the element withstand voltage of each transistor can be increased. In addition, when the breakdown voltage of the transistor cannot be sufficiently increased due to miniaturization or the like, six or more transistors may be required. A current icc9 generated by the current source circuit ICC9 serves as the driving voltage of the voltage source circuit VRR.

The voltage source circuit VRR includes an NMOS depletion type transistor M96, NMOS enhancement type transistors M97 and M98, and a high withstand voltage PMOS enhancement type transistor M99. The source and the gate of the transistor M96 are connected in common to the drain and the gate of the transistor M97 and the gate of the transistor M99 are connected to the output terminal TREF9. The source of the transistor M97 is connected to the drain and the gate of the transistor M98. The sources of the transistors M98 and M99 are connected to the ground potential GND. The transistor M98 is used to generate a high output voltage VREF9 and is not an essential constitutional requirement. The transistor M99 limits the drain voltage V96 of the transistor M96 so as not to exceed a predetermined level.

In such a circuit configuration, the main conductive paths of the transistors M96 to M98, that is, the drains and the sources thereof, are connected in series. In other words, a voltage from which the threshold voltages of the depletion type MOS transistor and the enhancement type MOS transistor are subtracted can be extracted.

That is, when the threshold voltage of the transistor M99 is denoted by VGS99, the drain voltage of the transistor M96 can be limited with the reference voltage VREF+VGS99 as the upper limit, thereby achieving the low withstand voltages of the transistors M96 to M98. In particular, it is possible to achieve the low breakdown voltage of the depletion MOS type transistor M97 having difficulty in achieving a high withstand voltage.

As described above, the reference voltage source REFS shown in FIG. 9 forms a predetermined voltage source by connecting a depletion type MOS transistor and an enhancement type MOS transistor in series in the same manner as the reference voltage source REF8 shown in FIG. 8. Incidentally, when it is desired to further increase the reference voltage VREF9 in FIG. 9, for example, a predetermined number of stages of enhancement NMOS type transistors may be connected in series between the source of the transistor M98 and the ground potential GND.

Figure 10:
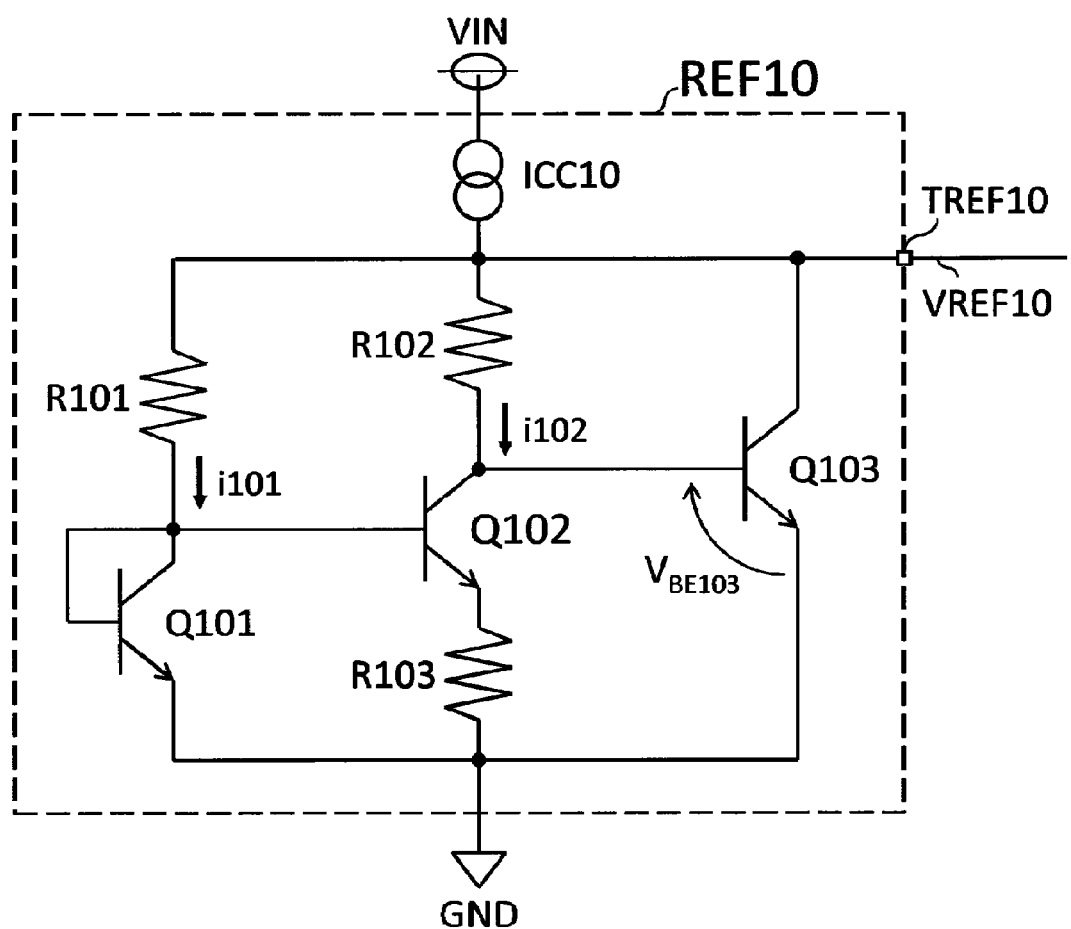
FIG. 10 is a view showing a circuit configuration of a band gap reference circuit used for a reference voltage source or a regulator voltage source according to the present disclosure.

FIG. 10 shows a voltage generation circuit used for the reference voltage generation circuit or the regulator voltage source according to the present disclosure. A voltage generation circuit REF10 is a band gap reference circuit and its temperature dependency can be suppressed when an output voltage VREF10 is set to around 1.2V.

The voltage generation circuit REF10 generates the output voltage VREF10 in response to the input of the power supply voltage VIN and outputs the output voltage VREF10 from an output terminal TREF10. The voltage generation circuit REF10 includes transistors Q101, Q102, and Q103, resistors R101, R102, and R103, and a constant current source ICC10. One end of the constant current source ICC10 is connected to the power supply voltage VIN, and the other end thereof is connected to one ends of the resistors R101 and R102, the drain of the transistor Q103, and the output terminal TREF10. The other end of the resistor R101 is connected to the collector and the base of the diode-connected transistor Q101 and the base of the transistor Q102. The emitter of the transistor Q101 is connected to the ground potential GND. The other end of the resistor R102 is connected to the collector of the transistor Q102 and the base of the transistor Q103. The emitter of the transistor Q102 is connected to one end of the resistor R103. The other end of the resistor R103 and the emitter of the transistor Q103 are connected to the ground potential GND. The output voltage VREF10 is determined by a voltage drop across the resistor R102. The voltage drop across the resistor R102 is determined by a collector current i102 flowing through the transistor Q102 and the resistance value of the resistor R102. The collector current i102 can be adjusted by appropriately selecting the resistance value of the resistor R103. Assuming that the base-to-emitter forward voltage of the transistor Q103 is $V_{BE103}$, the output voltage VREF10 is $V_{BE103}$+R102·i102.

When the electric charge of electrons is q, the Boltzmann constant is k, the absolute temperature is T, the collector current flowing through the transistor Q101 is i101, the collector current flowing through the transistor Q102 is i102, the base-to-emitter forward voltage of the transistor Q103 is $V_{BE103}$, and the resistance values of the resistors R101, R102, and R103 are r101, r102, and r103, respectively, the reference voltage VREF10 taken out from the voltage generation circuit REF10 can be expressed as the following equation.

$$\text{VREF10}=V_{BE103}+(r102/r103)\cdot(kT/q)\cdot\ln(i101/i102)$$

Based on the above equation, for example, when i101/i102 is fixed at 10, the resistance ratio of r102/r103 is set to three values of 5, 10, and 40 for the sake of convenience of calculation, $V_{BE103}$ is set to 0.65V, and kT/q is set to 26 mV, VREF10 is 0.95V for r102/r103 of the value 5. VREF10 is 1.25V for r102/r103 of the value 10. VREF10 is 3.04V for r102/r103 of the value 40. Although i101/i102 is fixed at 10 for the sake of convenience of calculation, the resistance ratio r102/r103 may be fixed and i101/i102 may be calculated as a parameter.

In order to eliminate the temperature dependency of the output voltage VREF10, it is known that VREF10 may be set to 1.2V or so in some embodiments.

Figure 11:
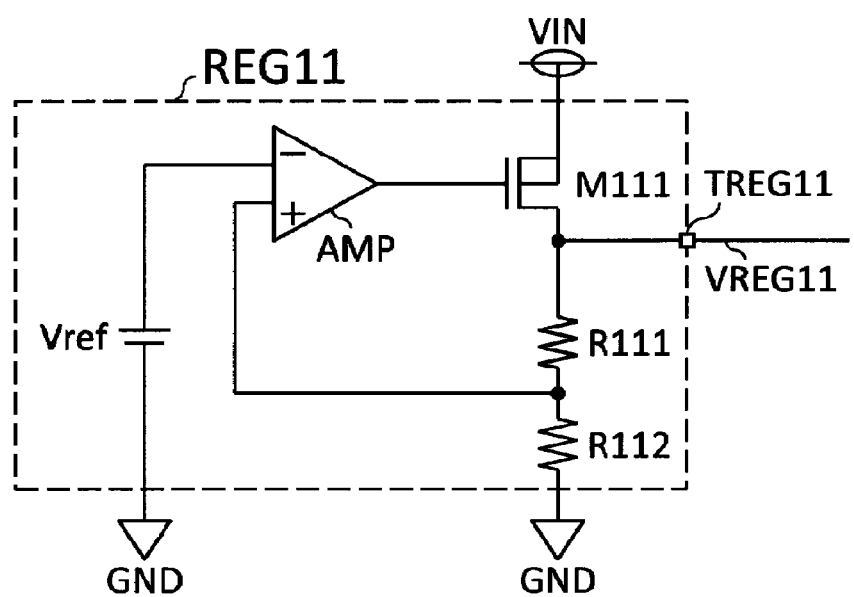
FIG. 11 is a view showing a circuit configuration of a linear regulator circuit used for a reference voltage source or a regulator voltage source according to the present disclosure.

FIG. 11 shows a voltage generation circuit used for the regulator voltage source according to the present disclosure. A voltage generation circuit REG11 has the basic circuit configuration of a linear regulator and has substantially the same configuration as the constant voltage generation circuit known in the related art.

The voltage generation circuit REG11 generates an output voltage VREG11 in response to the input of the power supply voltage VIN and outputs the output voltage VREG11 from an output terminal TREG11. The voltage generation circuit REG11 includes a PMOS enhancement type transistor M111, resistors R111 and R112, an amplifier AMP, and a reference voltage Vref. The source of the transistor M111 is connected to the power supply voltage VIN. The resistors R111 and R112 are connected in series between the drain of the transistor M111 and the ground potential GND. The inverting input terminal (−) of the amplifier AMP is connected to the ground potential GND via the reference voltage Vref, and the non-inverting input terminal (+) thereof is connected between the resistor R111 and the resistor R112.

The reference voltage Vref is, for example, about 0.9V to 1.2V and may be the reference voltage generated by the reference voltage generation circuits of FIGS. 8 to 10. The voltage VREG11 is taken out from the drain of the transistor M111, but the magnitude of the voltage VREG11 can be set to 3V to 5V, for example. The voltage VREG11 is set to a predetermined magnitude by adjusting the resistance ratio between the resistor R111 and the resistor R112. Assuming that the resistance ratio between the resistors R111 and R112 is α and assuming that α=R112/(R111+R112), the voltage VREG11 is Vref/α, which is inversely proportional to the value of α. Therefore, for example, when the reference voltage Vref=0.9V and α=1, the voltage VREG11 is 0.9V. When α=0.3, the voltage VREG11 is 3.0V. When α=0.18, the voltage VREG11 is 5.0V.

As described above, the voltage generation circuit REG11 can generate the desired output voltage VREG11 by fixing the reference voltage Vref and adjusting the resistance ratio between the resistors R111 and R112 constituting a feedback circuit. Therefore, the voltage generation circuit REG11 can be applied to both of the reference voltage source REF and the regulator voltage source REG according to the present disclosure.

The reference voltage source REF according to the present disclosure can apply one of the voltage generation circuits shown in FIGS. 8 to 11. However, any one of the voltage generation circuits of FIGS. 8 to 10 which do not have a feedback system may be adopted as long as it can generate a relatively low voltage source of about 1V. Thus, for example, in FIG. 1, the transistor M2 (second switching means) can be set to the turn-on state from when the power supply voltage VIN supplied to the power supply terminal Tin has a relatively low level, and the power supply voltage monitoring output signal VOUT taken out from the output terminal Tout can be maintained at a low level (L).

As described above, the power supply voltage monitoring circuit according to the present disclosure has extremely high industrial applicability since it can be used for a low power supply voltage as well as a high power supply voltage.

The power supply voltage monitoring circuit according to the present disclosure includes a circuit part operating with a low power supply voltage prior to the circuit operation of a comparator in a region where the power supply voltage is relatively low until the comparator enters a normal circuit operation, and a power supply voltage monitoring output signal is maintained at a predetermined value by this circuit part, which makes it possible to execute a normal circuit operation even with a low power supply voltage.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A power supply voltage monitoring circuit comprising:
   an input terminal;
   an output terminal;
   a ground terminal;
   a voltage dividing circuit configured to generate a first divided voltage and a second divided voltage from a power supply voltage applied to the input terminal;
   a reference voltage source configured to generate a reference voltage based on the power supply voltage;
   a regulator voltage source configured to generate a regulator voltage higher than the reference voltage based on the power supply voltage;
   a comparator configured to generate a first binary output signal by comparing the reference voltage with the first divided voltage, using the regulator voltage as a driving source;
   a first switching part having a main conductive path connected between the output terminal and the ground terminal and responsive to the first binary output signal; and
   a second binary converting part configured to generate a second binary output signal in response to the second divided voltage, using the reference voltage as a driving source,
   wherein a binary power supply voltage monitoring output signal to monitor a magnitude of the power supply voltage is generated according to logical operation of the first binary output signal and the second binary output signal.

2. The power supply voltage monitoring circuit of claim 1, wherein the binary power supply voltage monitoring output signal is generated based on at least one among an OR operation, a NOR operation, an AND operation, and a NAND operation of the first binary output signal and the second binary output signal.

3. The power supply voltage monitoring circuit of claim 1, further comprising:
   a second switching part having a main conductive path connected in parallel to the main conductive path of the first switching part and responsive to the second binary output signal,
   wherein the binary power supply voltage monitoring output signal is generated based on a wired OR operation of the first switching part and the second switching part.

4. The power supply voltage monitoring circuit of claim 3, wherein the second binary converting part includes an inverter,
   wherein the inverter outputs the second binary output signal from an output side in response to the second divided voltage applied to an input side, and
   wherein the second binary output signal is applied to an input side of the second switching part.

5. The power supply voltage monitoring circuit of claim 1, wherein the second binary output signal transitions to a power supply voltage lower than the power supply voltage when the first binary output signal transitions.

6. The power supply voltage monitoring circuit of claim 1, wherein the second divided voltage is set to be higher than the first divided voltage.

7. The power supply voltage monitoring circuit of claim 1, wherein the voltage dividing circuit includes a first resistor, a second resistor, and a third resistor connected in series from the input terminal toward the ground terminal, and
   wherein the first divided voltage is generated at a connection point between the second resistor and the third resistor and the second divided voltage is generated at a connection point between the first resistor and the second resistor.

8. The power supply voltage monitoring circuit of claim 7, wherein the voltage dividing circuit further includes a fourth resistor connected in series to the first resistor, the second resistor, and the third resistor from the input terminal toward the ground terminal, and
   wherein an output of a third switching part responsive to the first binary output signal is connected to a connection point between the third resistor and the fourth resistor, and the first divided voltage has two values according to turn-on/off operation of the third switching part.

9. The power supply voltage monitoring circuit of claim 1, wherein the reference voltage source or the regulator voltage source is selected among a linear regulator, a depletion type voltage source, and a band gap reference circuit.

10. The power supply voltage monitoring circuit of claim 9, wherein both the reference voltage source and the regulator voltage source are the linear regulator.

11. The power supply voltage monitoring circuit of claim 9, wherein the reference voltage source is selected from the depletion type voltage source and the band gap reference circuit.

12. The power supply voltage monitoring circuit of claim 9, wherein the reference voltage source is the depletion type voltage source, and the regulator voltage source is the linear regulator.

13. The power supply voltage monitoring circuit of claim 1, wherein a pull-up resistor is connected between the output terminal and a pull-up voltage.

\* \* \* \* \*